US012607689B2

(12) United States Patent
Cho et al.

(10) Patent No.: US 12,607,689 B2
(45) Date of Patent: Apr. 21, 2026

(54) METHOD FOR EXTRACTING CHARACTERISTICS OF BROADBAND PASSIVE ELEMENT AND APPARATUS FOR EXTRACTING CHARACTERISTICS OF BROADBAND PASSIVE ELEMENT

(71) Applicant: Huwin Co., Ltd., Seongnam-si (KR)

(72) Inventors: Jaeyong Cho, Seoul (KR); Jong Hyuk Jeong, Yongin-si (KR); Seung Il Jeung, Seongnam-si (KR)

(73) Assignee: Huwin Co., Ltd., Seongnam-si (KR)

( * ) Notice: Subject to any disclaimer, the term of this patent is extended or adjusted under 35 U.S.C. 154(b) by 294 days.

(21) Appl. No.: 18/163,941

(22) Filed: Feb. 3, 2023

(65) Prior Publication Data

US 2023/0266404 A1 Aug. 24, 2023

(30) Foreign Application Priority Data

Feb. 21, 2022 (KR) ........................ 10-2022-0022552

(51) Int. Cl.
*G01R 31/52* (2020.01)
*G01R 1/04* (2006.01)

(52) U.S. Cl.
CPC ........... *G01R 31/52* (2020.01); *G01R 1/0408* (2013.01)

(58) Field of Classification Search
CPC ...... G01R 31/52; G01R 1/0408; G01R 27/04; G01R 27/2605; G01R 35/005;
(Continued)

(56) References Cited

U.S. PATENT DOCUMENTS

| | | | |
|---|---|---|---|
| 7,124,049 B2 | 10/2006 | Wong et al. | |
| 2007/0030012 A1* | 2/2007 | Kamitani | ............. G01R 35/005 |
| | | | 324/601 |
| 2009/0224772 A1 | 9/2009 | Jagannathan et al. | |

FOREIGN PATENT DOCUMENTS

| | | | | |
|---|---|---|---|---|
| JP | 200462407 A | * | 2/2004 | |
| KR | 20020073037 A | * | 9/2002 | |

OTHER PUBLICATIONS

Eegen at al, "'Thru-Reflect-Line': An Improved Technique for Calibrating the Dual Six-Port Automatic Network Analyzer", IEEE Transaction Microwave Theory and Techniques, vol. MTT-27, No. 12. Dec. 1979, 7 pages.

* cited by examiner

*Primary Examiner* — Catherine T. Rastovski
*Assistant Examiner* — Emma Alexander
(74) *Attorney, Agent, or Firm* — Dority & Manning, P.A.

(57) ABSTRACT

A method for extracting characteristics of broadband passive element includes: acquiring an open condition measurement S-parameter, a first short condition measurement S-parameter, and a second short condition measurement S-parameter that are S-parameter values measured for each of three connection conditions of the broadband passive element at a first port which is one direction of the broadband passive element; deriving optimal resistance, optimal inductance, and optimal capacitance by performing an RLC optimization process of the three connection conditions of the broadband passive element; and extracting the S-parameter of the broadband passive element based on the obtained open condition measurement S-parameter, first short condition measurement S-parameter, and second short condition measurement S-parameter, and the derived optimum resistance, optimum inductance, and optimum capacitance.

22 Claims, 15 Drawing Sheets

(58) Field of Classification Search
CPC .... G01R 31/2863; G01R 1/067; G01R 27/26;
G01R 27/18; G01R 27/20; G01R
31/2803; G01R 31/56; G06N 20/00
See application file for complete search history.

(a) Open condition socket (b) First short condition socket (c) Second short condition socket (a) Open condition socket (b) First short condition socket (c) Second short condition socket (a) Open condition MLCC          (b) First short condition MLCC (c) Second short condition MLCC (a) Open condition MLCC (b) First short condition MLCC (c) Second short condition MLCC

METHOD FOR EXTRACTING CHARACTERISTICS OF BROADBAND PASSIVE ELEMENT AND APPARATUS FOR EXTRACTING CHARACTERISTICS OF BROADBAND PASSIVE ELEMENT

CROSS-REFERENCE TO RELATED APPLICATION

This application claims priority to and the benefit of Korean Patent Application No. 10-2022-0022552 filed in the Korean Intellectual Property Office on Feb. 21, 2022, the entire contents of which are incorporated herein by reference.

BACKGROUND OF THE INVENTION

(a) Field of the Invention

The present invention relates to a method for extracting characteristics of a broadband passive element and an apparatus for extracting characteristics of a broadband passive element. More particularly, the present invention relates to a method for extracting characteristics of a broadband passive element and a method for extracting characteristics of a broadband passive element capable of extracting characteristics of a broadband passive element only by one-way measurement.

(b) Description of the Related Art

A scattering parameter (S-parameter) means a ratio of an output voltage to an input voltage in a frequency domain. Elements of the S-parameter include an input reflection coefficient such as S11, a transmission coefficient such as S21, and the like. The S-parameter is widely used to measure characteristics of a system operating at a radio frequency, and is generally measured by a network analyzer.

Elements, which consume, store, or transmit electrical energy in electronic circuits, such as resistors, capacitors, inductors, and connectors but do not amplify or convert the electrical energy, are called passive elements. In order to measure the S-parameter of a 2-port passive element, both a first port and a second port of the passive element need to be measured. For example, U.S. Pat. 7,124,049 discloses a configuration of calculating device characteristics by measuring ports at both ends of a 2-port device through a vector network analyzer (VNA).

In order to test performance of semiconductor chips such as a central processing unit (CPU) and an application processor (AP), a socket, which is a passive element for connecting the semiconductor chip to a measurement board, is required. The socket is mounted on the measuring board, and the semiconductor chip is positioned on the socket. The socket has a very small conductor pin structure of several nm to several μm. In order to understand the exact performance of the semiconductor chip, it is necessary to know in advance the S-parameters, which are characteristics of the socket. However, when the socket has the very small conductor pin structure, it is difficult to measure ports at both ends of the socket even through a microprobe. In addition, due to the structure of the socket, the first port contacting the semiconductor chip may be measured, but the second port opposite the first port may not be measured. That is, the socket may have a structure capable of only one-way measurement.

Therefore, there is a need for a method capable of extracting characteristics of a broadband passive element only by measuring one port of the passive element (one-way measurement).

The above information disclosed in this Background section is only for enhancement of understanding of the background of the invention, and therefore it may contain information that does not form the prior art that is already known in this country to a person of ordinary skill in the art.

SUMMARY OF THE INVENTION

The present invention has been made in an effort to provide a method for extracting characteristics of a broadband passive element capable of extracting characteristics of a broadband passive element only by one-way measurement, a computer-readable recording medium recording the same, and an apparatus for extracting characteristics of a broadband passive element.

An exemplary embodiment of the present invention provides a method for extracting characteristics of broadband passive element, including: acquiring an open condition measurement S-parameter, a first short condition measurement S-parameter, and a second short condition measurement S-parameter that are S-parameter values measured for each of three connection conditions of the broadband passive element at a first port which is one direction of the broadband passive element; deriving optimal resistance, optimal inductance, and optimal capacitance by performing an RLC optimization process of the three connection conditions of the broadband passive element; and extracting the S-parameter of the broadband passive element based on the obtained open condition measurement S-parameter, first short condition measurement S-parameter, and second short condition measurement S-parameter, and the derived optimum resistance, optimum inductance, and optimum capacitance.

The broadband passive element may include three conductor pins, and the three connection conditions may include an open condition in which all of the three conduction pins at a second port in the other direction of the broadband passive element are open, a first short condition in which two of three conductive pins at the second port are connected and the other conductive pin is open, a second short condition in which all the three conduction pins at the second port are connected.

The step (a) may include measuring the open condition measurement S-parameter by measuring the first port of the broadband passive element in which the second port is in the open condition using a GSG microprobe, measuring the first short condition measurement S-parameter by measuring the first port of the broadband passive element in which the second port is in the first short condition using the GSG microprobe, and measuring the second short condition measurement S-parameter by measuring the first port of the broadband passive element in which the second port is in the second short condition using the GSG microprobe.

The broadband passive element may include two conductor pins, and the three connection conditions may include an open condition in which two conduction pins at a second port in the other direction of the broadband passive element are open; a first short condition in which the two conductive pins at the second port are connected with a short line having a first width; and a second short condition in which the two conduction pins at the second port are connected with a short line having a second width greater than the first width.

The step (a) may include measuring the open condition measurement S-parameter by measuring the first port of the broadband passive element in which the second port is in the open condition using an SG microprobe, measuring the first short condition measurement S-parameter by measuring the first port of the broadband passive element in which the second port is in the first short condition using the SG microprobe, and measuring the second short condition measurement S-parameter by measuring the first port of the broadband passive element in which the second port is in the second short condition using the SG microprobe.

In the step (C), the S-parameter of the broadband passive element may be extracted based on the S-parameter formula below.

$$S11 = S11_{mo} - \frac{S11_o \times S21^2}{1 - S11_o \times S22}$$

$$S21 = \sqrt{(S11_{mo} - S11_{ms1})/\left(\frac{S11_o}{1 - S11_o \times S22} - \frac{S11_{s1}}{1 - S11_{s1} \times S22}\right)}$$

$$S22 = \frac{(K-1)S11_o + S11_{s1} - KS11_{s2}}{KS11_o S11_{s1} - S11_o S11_{s2} + (1-K)S11_{s1}S11_{s2}}$$

$$K = \frac{S11_{mo} - S11_{ms1}}{S11_{mo} - S11_{ms2}},$$

$$S11_o = \frac{Z_{open} - Z_{ref}}{Z_{open} + Z_{ref}}$$

$$S11_{s1} = \frac{Z_{ind1} - Z_{ref}}{Z_{ind1} + Z_{ref}},$$

$$S11_{s2} = \frac{Z_{ind2} - Z_{ref}}{Z_{ind2} + Z_{ref}}$$

$S11_0$ may be an RLC modeling S-parameter of an open condition of the broadband passive element, $S11_{s1}$ may be an RLC modeling S-parameter of a first short condition of the broadband passive element, $S11_{s2}$ may be an RLC modeling of a second short condition of the broadband passive element, $S11_{mo}$ may be an open condition measurement S-parameter, $S11_{ms1}$ may be a first short condition measurement S-parameter, $S11_{ms2}$ may be a second short condition measurement S-parameter, $Z_{ref}$ may be a port reference impedance, $Z_{open}$ may be impedance in an open condition, $Z_{ind1}$ may be impedance in the first condition, and $Z_{ind2}$ may be impedance in a second short condition.

The step (b) may include setting a range of resistance, inductance, and capacitance for the three connection conditions, defining a cost function at a low frequency as an absolute value of a difference between S11 and S22 in the S-parameter of the broadband passive element, and deriving the resistance, inductance, and capacitance at which the cost function is minimized through an optimization algorithm using the S-parameter formula and the cost function.

The broadband passive element may be a socket for connecting a semiconductor chip to a measurement board.

The broadband passive element may be a multi-layer ceramic capacitor including a first electrode, a second electrode, and a ceramic dielectric material disposed between the first electrode and the second electrode.

The step (a) may include: providing first pads at a first port of the multi-layer ceramic capacitor; providing second pads at a second port of the multi-layer ceramic capacitor; and contacting the first electrode to one of the first pads and contacting the second electrode to one of the second pads.

The first pads and the second pads may include three pads, and the three connection conditions may include an open condition in which all of the second pads are open, a first short condition in which two adjacent pads of the second pads are connected and the other pad is open, and a second short condition in which all three pads among the second pads are connected.

The first pads and the second pads may include two pads, and the three connection conditions may include an open condition in which all of the second pads are open, a first short condition in which two adjacent pads among the second pads are connected by a line having a first area, and a second short condition in which two adjacent pads among the second pads are connected by a line having a second area greater than the first area.

Another embodiment of the present invention provides an apparatus for extracting characteristics of broadband passive element including: a measuring unit configured to measure an open condition measurement S-parameter, a first short condition measurement S-parameter, and a second short condition measurement S-parameter that are S-parameter values measured for each of three connection conditions of the broadband passive element at a first port which is one direction of the broadband passive element; an S-parameter calculation unit configured to extract an S-parameter of the broadband passive element based on the open measurement S-parameter, the first short condition measurement S-parameter, and the second short condition measurement S-parameter measured by the measuring unit, and optimal resistance, inductance, and capacitance for three connection conditions; and an output unit configured to output the S-parameter of the broadband passive element output by the S-parameter calculation unit.

The S-parameter calculation unit may include an RLC optimizer configured to perform an RLC optimization process for optimizing variables of the resistance, inductance, and capacitance for the three connection conditions, and an S-parameter extraction unit configured to extract the S-parameter of the broadband passive element based on the optimal resistance, inductance, and capacitance output by the RLC optimizer and the open condition measurement S-parameter, the first short condition measurement S-parameter, and the second short condition measurement S-parameter measured by the measuring unit.

The RLC optimization unit may set a range of resistance, inductance, and capacitance for the three connection conditions, define a cost function at a low frequency as an absolute value of a difference between S11 and S22 in the S-parameter of the broadband passive element, and derive the resistance, inductance, and capacitance at which the cost function is minimized through an optimization algorithm using the S-parameter formula and the cost function.

Yet another embodiment of the present invention provides a non-transitory computer program product storing instructions executed by at least one processor of at least one computer system.

The non-transitory computer program product may include: an operation of measuring an open condition measurement S-parameter, a first short condition measurement S-parameter, and a second short condition measurement S-parameter that are S-parameter values measured for each of three connection conditions of the broadband passive element at a first port which is one direction of the broadband passive element; an operation of deriving optimal resistance, optimal inductance, and optimal capacitance by performing an RLC optimization process of the three connection conditions of the broadband passive element; and an operation of extracting the S-parameter of the broadband passive element based on the obtained open condition measurement S-parameter, first short condition measurement S-parameter, and second short condition measurement S-parameter, and the derived optimum resistance, optimum inductance, and optimum capacitance.

According to an embodiment of the present invention, the apparatus and method for extracting characteristics of a broadband passive element may extract characteristics of a broadband passive element only by a one-way measurement.

DETAILED DESCRIPTION OF THE EMBODIMENTS

Figure 1:
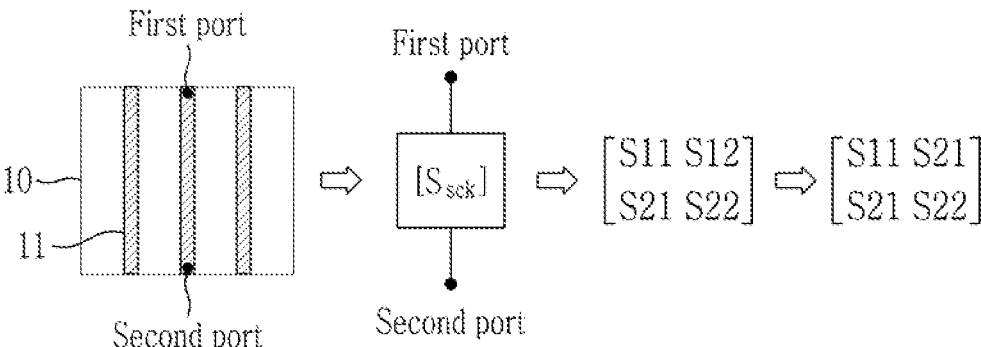
FIG. 1 is a diagram illustrating a port and an S-parameter of a socket that is a broadband passive element according to an embodiment of the present invention.

Hereinafter, exemplary embodiments of the present invention will be described in detail with reference to the accompanying drawings so that those skilled in the art to which the present invention pertains may easily practice the present invention. However, the present invention may be implemented in various different forms and is not limited to exemplary embodiments provided herein.

Portions unrelated to the description will be omitted in order to obviously describe the present invention, and similar components will be denoted by the same or similar reference numerals throughout the present specification.

Throughout the present specification, unless explicitly described to the contrary, "comprising" any components will be understood to imply the inclusion of other components rather than the exclusion of any other components.

Hereinafter, an apparatus and method for extracting characteristics of a broadband passive element capable of extracting characteristics of a broadband passive element only by one-way (i.e., a port in one direction of a passive element) measurement will be described with reference to the drawings. As a broadband passive element, a socket for connecting a semiconductor chip to a measurement board will be described as an example.

FIG. 1 is a diagram illustrating a port and an S-parameter of a socket that is a broadband passive element according to an embodiment of the present invention.

Referring to FIG. 1, the socket 10 includes a plurality of conductor pins 11 of three or more. A portion of the socket 10 in contact with the measurement board is defined as a first port, and a portion in contact with the semiconductor chip opposite to the first port is defined as a second port.

Since the socket 10 is a passive network, S12=S21 may be set in an S-parameter $[S_{sck}]$ of the socket 10 using reciprocity. Therefore, the S-parameter $[S_{sck}]$ of the socket 10 may be defined as in Equation 1.

$$[S_{sck}] = \begin{bmatrix} S11 & S12 \\ S21 & S22 \end{bmatrix} = \begin{bmatrix} S11 & S21 \\ S21 & S22 \end{bmatrix} \qquad \text{(Equation 1)}$$

According to an embodiment of the present invention, in the socket measurement using a microprobe, three connection conditions of the socket are configured to overcome the limitation of only one-way measurement. That is, in FIG. 1, the connection condition of the socket is configured in a condition (open condition) in which one direction (second port) of the socket 10 is open, a condition (first short condition) in which only two adjacent conductor pins are connected in the second port, and a condition (second short condition) in which all conductor pins are connected in a second port.

Figure 2:
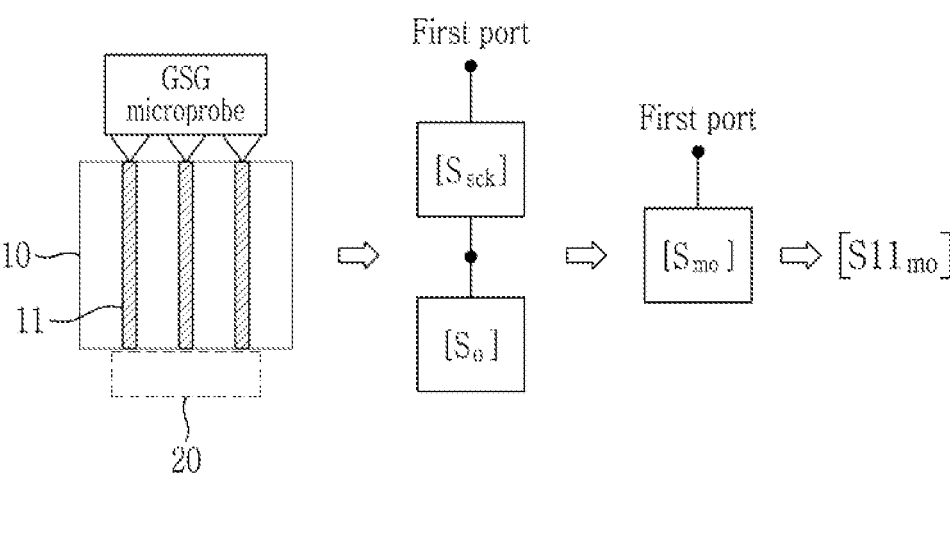
FIG. 2 is a diagram illustrating an open condition socket and an S-parameter for extracting an S-parameter of a socket by one-way measurement according to an embodiment of the present invention.
Figure 2:
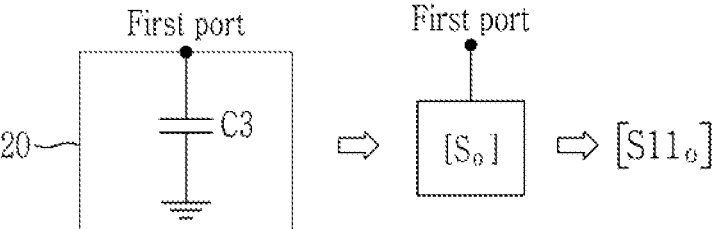

FIG. 2 is a diagram illustrating an open condition socket and an S-parameter for extracting an S-parameter of a socket by one-way measurement according to an embodiment of the present invention.

Referring to FIG. 2, the one-way measurement of the socket 10 may be measuring the first port of the socket 10 using a ground signal ground (GSG) microprobe.

The open condition (open condition) socket means that the second port of the socket 10 is an open condition 20. The S-parameter of the open condition socket may include the S-parameter $[S_{sck}]$ of the socket 10 and an LC modeling S-parameter $[S_o]$ of the open condition 20 formed in the second port of the socket 10. The S-parameter of the open condition socket may be measured with a GSG microprobe. According to the embodiment of the present invention, since the GSG microprobe is measured in one-way (i.e., the first port) of the socket, the measured S-parameter of the open condition socket has only its own components, not a matrix form. Therefore, an open condition measurement S-parameter $[S_{mo}]$ may be defined as in Equation 2.

$$[S_{mo}]=[S11_{mo}] \qquad \text{(Equation 2)}$$

An equivalent circuit of the open condition 20 may be regarded as a capacitor C3 circuit between the first port and a ground, and an RLC modeling S-parameter $[S_o]$ of the open condition 20 may be defined as in Equation 3.

$$[S_o] = [S11_o] \qquad \text{(Equation 3)}$$

$$S11_o = \frac{Z_{open} - Z_{ref}}{Z_{open} + Z_{ref}}$$

$$Z_{open} = \frac{1}{i2\pi fC_3}$$

Here, $Z_{ref}$ is a port reference impedance of the S-parameter, $Z_{open}$ is an impedance of the open condition, f of the S-parameter is a frequency of an input signal, and C3 is a capacitance of the capacitor C3 between the first port and the ground.

Figure 3:
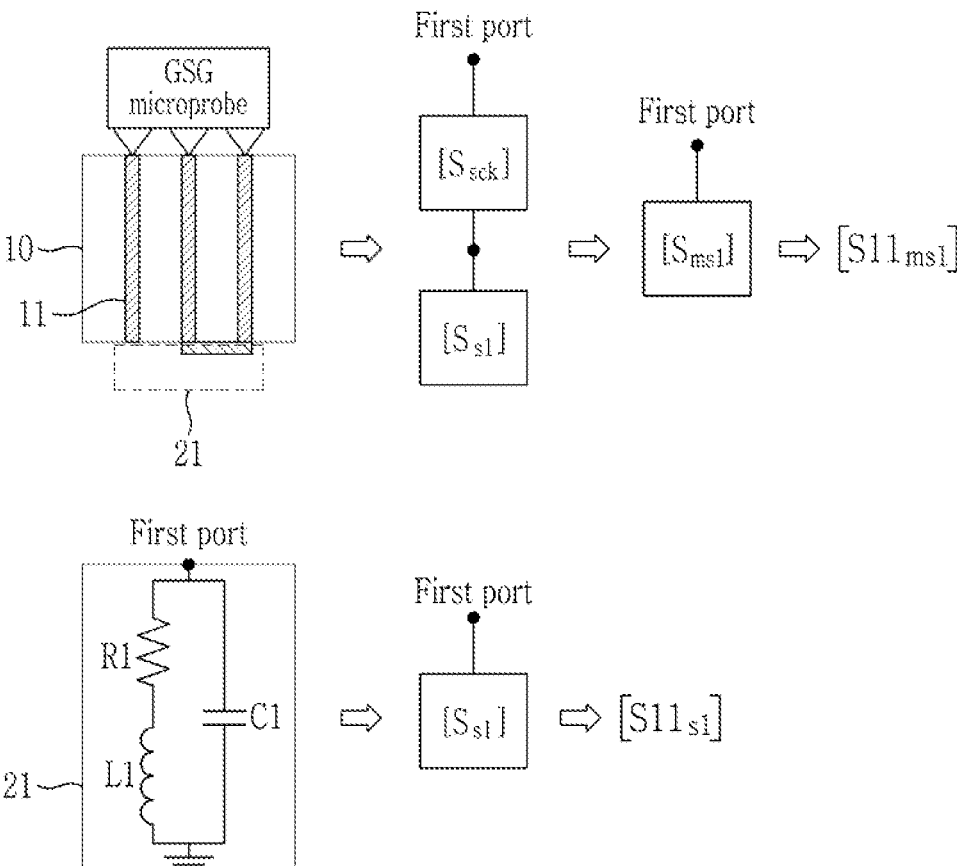
FIG. 3 is a diagram illustrating a first short socket and an S-parameter for extracting an S-parameter of a socket by one-way measurement according to an embodiment of the present invention.

FIG. 3 is a diagram illustrating a first short socket and an S-parameter for extracting an S-parameter of a socket by one-way measurement according to an embodiment of the present invention.

Referring to FIG. 3, the first short condition socket includes a structure in which a first short condition 21 is formed (connected) in (to) the second port of the socket 10. The first short condition 21 means a condition in which only two conductor pins 11 of three adjacent conductor pins are connected (contacted) to each other, and the other conductor pin is not connected.

The S-parameter of the first short condition socket may include the S-parameter $[S_{sck}]$ of the socket 10 and the RLC modeling S-parameter $[S_{o1}]$ of the first short condition 21 formed in the second port of the socket 10. The S-parameter of the first short condition socket may be measured with a GSG microprobe, and the S-parameter of the first short condition socket measured with the GSG microprobe in one direction may be measured as the first short condition measurement $[S_{mo1}]$ as shown in Equation 4.

$$[S_{ms1}]=[S11_{ms1}] \qquad \text{(Equation 4)}$$

The equivalent circuit of the first short condition 21 may be regarded as a resistor R1 and an inductor L1 connected in series between the first port and the ground, and a capacitor C1 circuit connected in parallel to the resistor R1 and inductor L1 connected in series, and the RLC modeling S-parameter $[S_{o1}]$ of the first short condition 21 may be defined as in Equation 5.

$$[S_{s1}] = [S11_{s1}] \qquad \text{(Equation 5)}$$

$$S11_{s1} = \frac{Z_{ind1} - Z_{ref}}{Z_{ind1} + Z_{ref}}$$

$$Z_{ind1} = \frac{R1 + i2\pi fL1}{((R1 + i2\pi fL1)*(i2\pi fC1) + 1)}$$

Here, $Z_{ind1}$ is the impedance of the first short condition, $R_1$ and $L_1$ are the resistance of the resistor R1 and the inductance of the inductor L1 connected in series between the first port and the ground, respectively, and $C_1$ is the capacitance of the capacitor C1 between the inductance between the first port and the ground.

Figure 4:
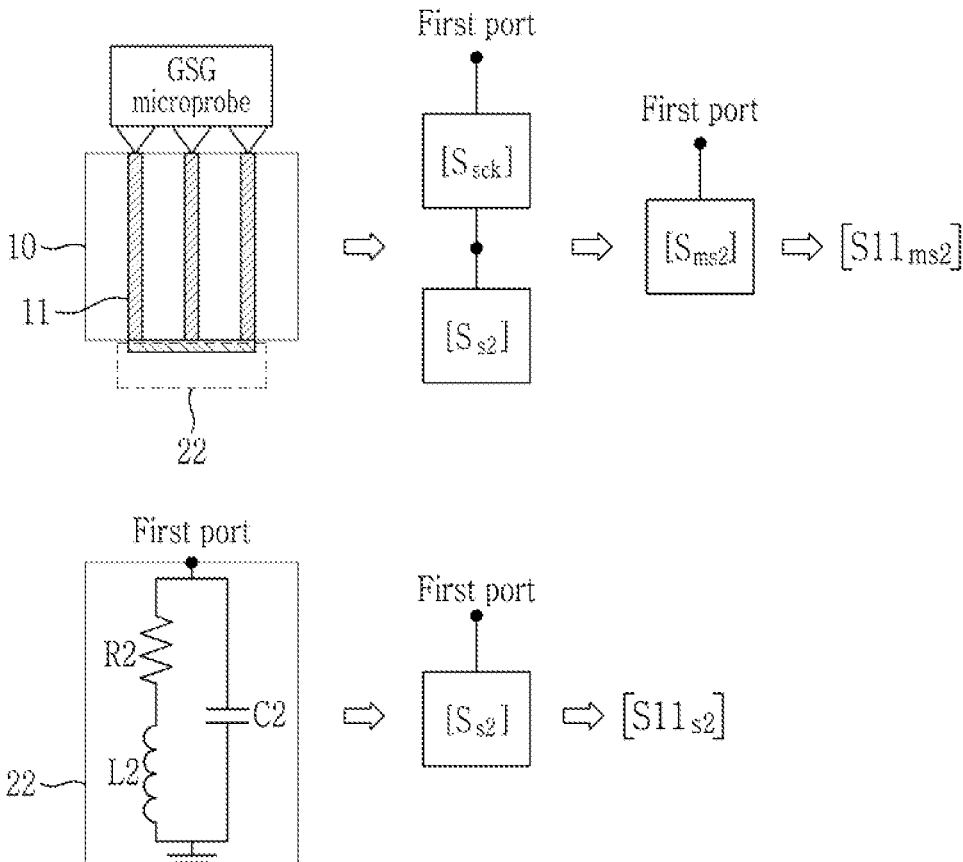
FIG. 4 is a diagram illustrating a second short condition and an S-parameter for extracting an S-parameter of a socket by one-way measurement according to an embodiment of the present invention.

FIG. 4 is a diagram illustrating a second short condition and an S-parameter for extracting an S-parameter of a socket by one-way measurement according to an embodiment of the present invention.

Referring to FIG. 4, the second short condition socket includes a structure in which a second short condition 22 is formed (connected) in (to) the second port of the socket 10. The second short condition 22 means a condition in which three adjacent conductor pins 11 are connected (contacted) with each other.

The S-parameter of the second short condition socket may include the S-parameter $[S_{sck}]$ of the socket 10 and the RLC modeling S-parameter $[S_{o2}]$ of the second short condition 22 formed in the second port of the socket 10. The S-parameter of the second short condition socket may be measured with the GSG microprobe, and the S-parameter of the second short condition socket measured with the GSG microprobe in one direction may be measured as the second short condition measurement as shown in Equation 6.

$$[S_{ms2}]=[S11_{ms2}] \qquad \text{(Equation 6)}$$

The equivalent circuit of the second short condition 22 may be regarded as a resistor R2 and an inductor L2 connected in series between the first port and the ground, and a capacitor C2 circuit connected in parallel to the resistor R2 and inductor L2 connected in series, and the RLC modeling S-parameter of the second short condition 22 may be defined as in Equation 7.

$$[S_{s2}] = [S11_{s2}] \qquad \text{(Equation 7)}$$

$$S11_{s2} = \frac{Z_{ind2} - Z_{ref}}{Z_{ind2} + Z_{ref}}$$

$$Z_{ind2} = \frac{R2 + i2\pi fL2}{((R2 + i2\pi fL2)*(i2\pi fC2) + 1)}$$

Here, $Z_{ind2}$ is the impedance of the second short condition, $R_2$ and $L_2$ are the resistance of the resistor R2 and the inductance of the inductor L2 connected in series between the first port and the ground, respectively, and $C_2$ is the capacitance of the capacitor C2 between the inductance between the first port and the ground.

Hereinafter, it has been described that the S-parameter $[S_{sck}]$ of the socket 10 may be derived by using the RLC modeling S-parameter $[S_o]$ of the open condition 20, the RLC modeling S-parameter $[S_{s1}]$ of the first short condition 21, and the RLC modeling S-parameter $[S_{s2}]$ of the second short condition 22.

Figure 5:
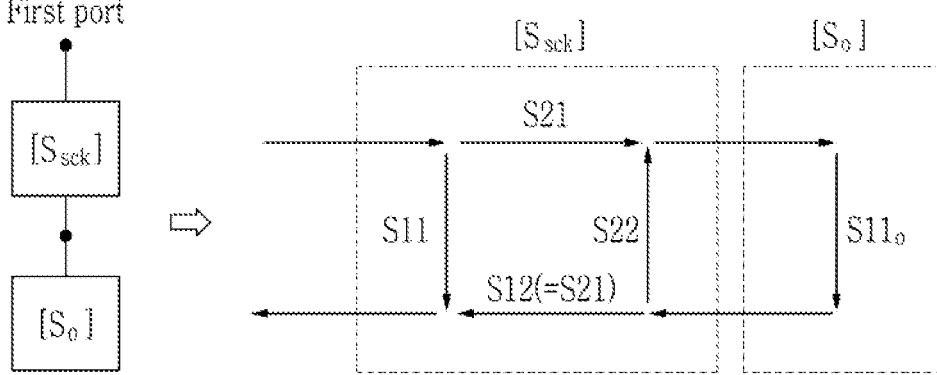
FIG. 5 is a diagram illustrating a correlation between an open condition measurement S-parameter, an S-parameter of a socket, and an open condition LC modeling S-parameter according to an embodiment of the present invention.

FIG. 5 is a diagram illustrating a correlation between the open condition measurement S-parameter, the S-parameter of the socket, and the open condition LC modeling S-parameter according to an embodiment of the present invention.

Referring to FIG. 5, by using a signal flow graph (SFG) and Mason's rule from Equations 1 to 3, the correlation between the open condition measurement S-parameter $[S_{mo}]$ and the S-parameter $[S_{sck}]$ of the socket 10 and RLC modeling S-parameter $[S_o]$ of the open condition 20 may be a shown in Equation 8.

$$S11_{mo} = S11 + \frac{S11_o \times S21^2}{1 - S11_o \times S22} \qquad \text{(Equation 8)}$$

In the same way, by using the signal flow graph and Mason's rule from Equations 1, 4, and 5, the correlation between the first short condition measurement S-parameter $[S_{ms1}]$, the S-parameter $[S_{sck}]$ of the socket 10, and the RLC modeling S-parameter $[S_{s1}]$ of the first short condition 21 may be derived as shown in Equation 9.

$$S11_{ms1} = S11 + \frac{S11_{s1} \times S21^2}{1 - S11_{s1} \times S22} \qquad \text{(Equation 9)}$$

By using the signal flow graph and Mason's rule from Equations 1, 6, and 7, the correlation between the second short condition measurement S-parameter $[S_{ms2}]$, the S-parameter $[S_{sck}]$ of the socket 10, and the RLC modeling S-parameter $[S_{s2}]$ of the second short condition 22 may be derived as shown in Equation 10.

$$S11_{ms2} = S11 + \frac{S11_{s2} \times S21^2}{1 - S11_{s2} \times S22} \qquad \text{(Equation 10)}$$

S-parameters S11, S21, and S22 of the socket 10 may be derived as shown in Equation 11 by arranging Equations 8 to 10 by solving simultaneous equations. Equation 11 becomes an S-parameter Equation of the socket 10 (broadband passive element).

$$S11 = S11_{mo} - \frac{S11_o \times S21^2}{1 - S11_o \times S22} \qquad \text{(Equation 11)}$$

$$S21 = \sqrt{(S11_{mo} - S11_{ms1}) \Big/ \left( \frac{S11_o}{1 - S11_o \times S22} - \frac{S11_{s1}}{1 - S11_{s1} \times S22} \right)}$$

$$S22 = \frac{(K-1)S11_o + S11_{s1} - KS11_{s2}}{KS11_o S11_{s1} - S11_o S11_{s2} + (1-K)S11_{s1}S11_{s2}}$$

$$K = \frac{S11_{mo} - S11_{ms1}}{S11_{mo} - S11_{ms2}},$$

$$S11_o = \frac{Z_{open} - Z_{ref}}{Z_{open} + Z_{ref}}$$

$$S11_{s1} = \frac{Z_{ind1} - Z_{ref}}{Z_{ind1} + Z_{ref}},$$

$$S11_{s2} = \frac{Z_{ind2} - Z_{ref}}{Z_{ind2} + Z_{ref}}$$

As can be seen from Equation 11, it can be seen that the S-parameters S11, S21, and S22 of the socket 10 may be derived by using the RLC modeling S-parameter $[S_o]$ of the open condition, the RLC modeling S-parameter $[S_{s1}]$ of the first short condition, and the RLC modeling S-parameter $[S_{s2}]$ of the second short condition.

In addition, as can be seen from Equations 3, 5, and 7, since the RLC modeling S-parameter $[S_o]$ of the open condition, the RLC modeling S-parameter $[S_{s1}]$ of the first short condition, and the RLC modeling S-parameter $[S_{s2}]$ of the second short condition are determined by the impedance obtained by resistances $R_1$ and $R_2$, inductances $L_1$ and $L_2$ and capacitances $C_1$, $C_2$, and $C_3$ for the three connection conditions, respectively, it can be seen that the S-parameters S11, S21, and S22 of the socket 10 are determined by the resistances R1 and R2, the inductances $L_1$ and $L_2$ and the capacitances $C_1$, $C_2$, and $C_3$ in the three connection conditions.

Hereinafter, a method of extracting characteristics of a broadband passive element using the definitions and equations of the above-described S-parameters will be described. The broadband passive element may include not only the socket 10 described above, but also resistors, capacitors, inductors, connectors, and the like.

Figure 6:
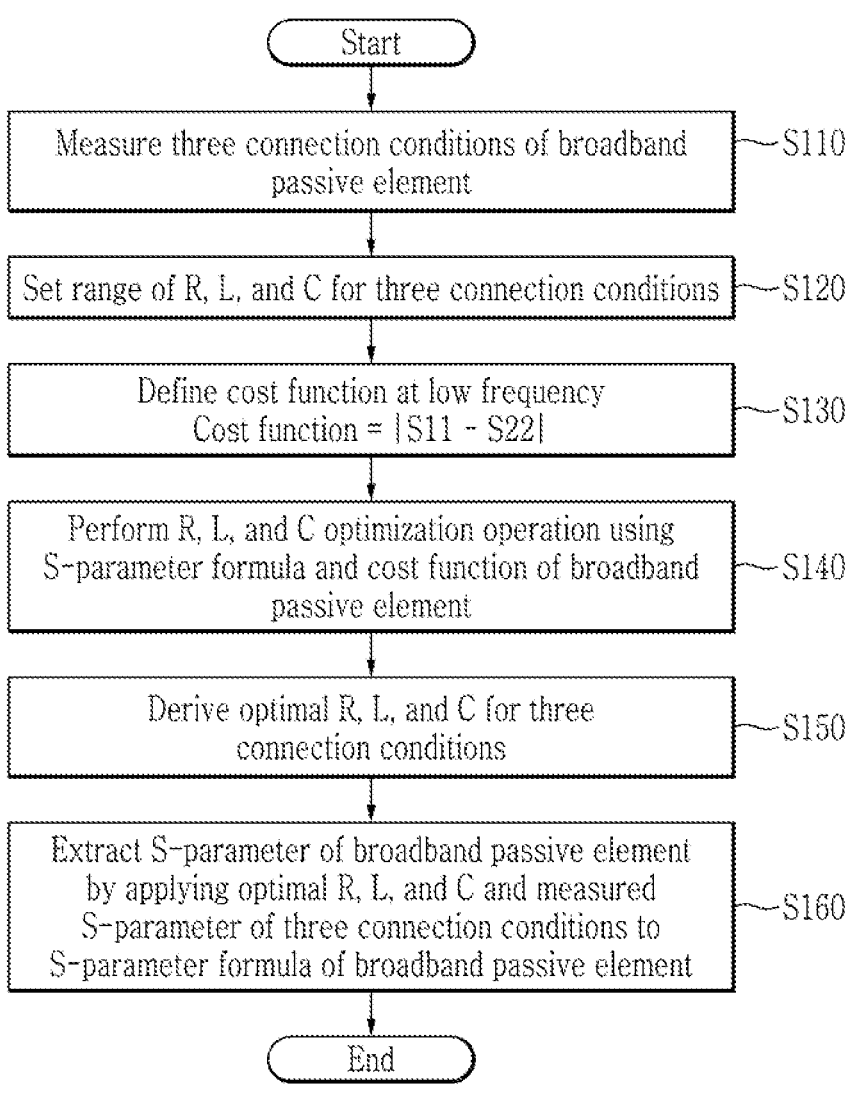
FIG. 6 is a flowchart illustrating a method for extracting characteristics of a broadband passive element according to an embodiment of the present invention.

FIG. 6 is a flowchart illustrating a method for extracting characteristics of a broadband passive element according to an embodiment of the present invention.

Referring to FIG. 6, the three connection conditions (open condition, first short condition, and second short condition) of the broadband passive element are measured (S110). In other words, in one-way measurement using a GSG micro-probe, the open condition measurement S-parameter $[S_{mo}]$ may be measured as shown in FIG. 2, the first short condition measurement S-parameter may be measured as shown in FIG. 3, and the second measurement S-parameter $[S_{ms2}]$ may be measured as shown in FIG. 4.

In order to extract the S-parameters of the broadband passive element using Equation 11, in addition to the measurement S-parameters $[S_{mo}]$, $[S_{ms1}]$, and $[S_{ms2}]$ of the three connection conditions, the RLC modeling S-parameters $[S_o]$, $[S_{s1}]$, and $[S_{s2}]$ for the three connection conditions need to know.

Accordingly, the values of the resistances R1 and R2, the inductances $L_1$ and $L_2$, and the capacitances $C_1$, $C_2$, and $C_3$ for the three connection conditions need to be derived. However, since there are many variables R1, R2, L1, L2, C1, C2, and C3 to find compared to the number of Equations, it is difficult to directly derive the values of the resistances R1 and R2, the inductances $L_1$ and $L_2$, and the capacitances $C_1$, $C_2$, and $C_3$ for the three connection conditions.

Accordingly, in an embodiment of the present invention, the values of the resistances R1 and R2, the inductances $L_1$ and $L_2$, and the capacitances $C_1$, $C_2$, and $C_3$ for the three connection conditions are derived through an RLC optimization process.

As the RLC optimization process, first, ranges of the resistances R1 and R2, the inductances $L_1$ and $L_2$, and the capacitances $C_1$, $C_2$, and $C_3$ for the three connection conditions may be set (S120). Depending on the type of the broadband passive element, the ranges of the resistance, the inductance, and the capacitance that the three connection conditions of the broadband passive element may actually have may be determined. That is, the ranges of the resistances R1 and R2, the inductances $L_1$ and $L_2$, and the capacitances $C_1$, $C_2$, and $C_3$ for the three connection conditions may be preset in correspondence with the broadband passive element. The ranges of the resistances R1 and R2, the inductances $L_1$ and $L_2$, and the capacitances $C_1$, $C_2$, and $C_3$ for the three connection conditions may be preset to reduce the execution time of the RLC optimization process.

Since the broadband passive element, for example, the socket 10 is a passive network with a small size of several nm to several μm, it may be assumed to be symmetrical at a low frequency (e.g., 100 MHz or less), and accordingly, in the S-parameters of Socket 10, S11 and S22 may be said to be the same or very similar. Therefore, the cost function at a low frequency may be defined as the absolute value Cost function=|S11-S22| of the difference between S11 and S22 in the S-parameter of the broadband passive element (S130).

The optimization process of the resistances R1 and R2, the inductances $L_1$ and $L_2$, and the capacitances $C_1$, $C_2$, and $C_3$ for the three connection conditions may be performed using the S-parameter equation (Equation 11) and cost function of broadband passive element (S140). The optimization process is a process of deriving the resistances R1 and R2, the inductances $L_1$ and $L_2$, and the capacitances $C_1$, $C_2$, and $C_3$ with minimized cost functions through various optimization algorithms such as a genetic algorithm.

The optimal resistances R1 and R2, inductances $L_1$ and $L_2$, and capacitances $C_1$, $C_2$, and $C_3$ for the three connection conditions may be derived through the optimization process (S150).

By applying the derived optimal resistances R1 and R2, inductances $L_1$ and $L_2$, and capacitances $C_1$, $C_2$, and $C_3$ and the measurement S-parameters [$S_{mo}$], [$S_{ms1}$], and [$S_{ms2}$] in the three connection conditions to the S-parameter equations (Equation 11) of the broadband passive element, the S-parameter (e.g., the S-parameter of the socket 10) of the broadband passive element may be extracted (S160).

Hereinafter, an apparatus for performing the method for extracting characteristics of a broadband passive element according to an embodiment of the present invention will be described with reference to FIG. 7.

Figure 7:
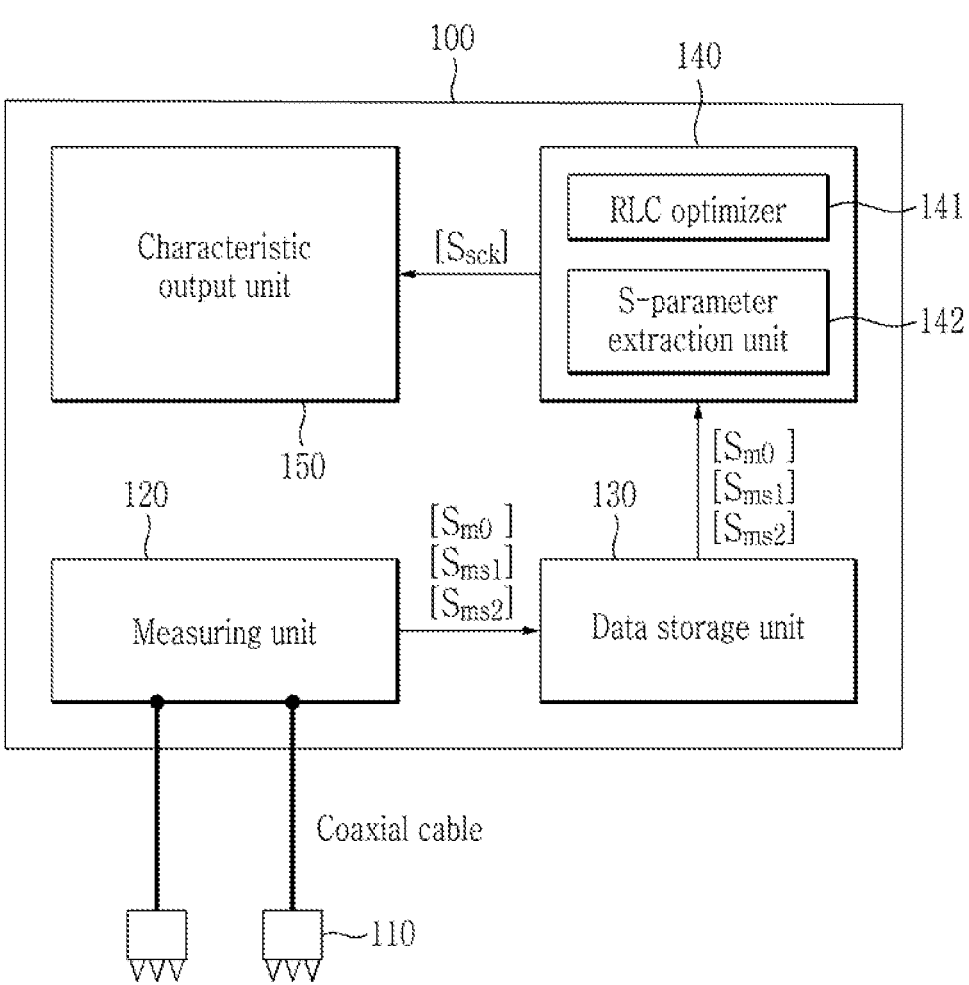
FIG. 7 is a block diagram illustrating an apparatus for extracting characteristics of a broadband passive element according to an embodiment of the present invention.
Figure 8:
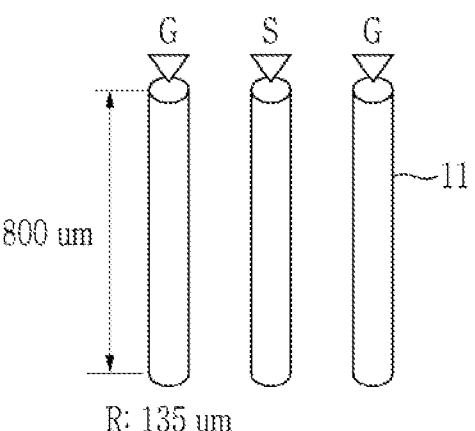
FIGS. 8A to 8C are diagrams illustrating an open condition socket, a first short condition socket, and a second short condition socket according to an embodiment.
Figure 8:
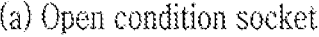
Figure 8:
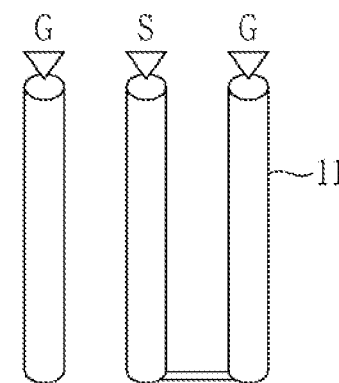
Figure 8:
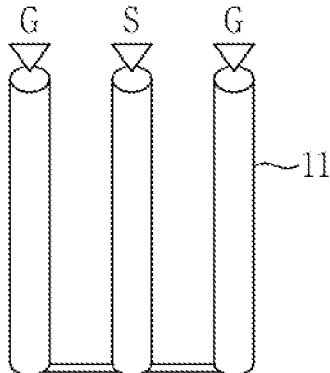

FIG. 7 is a block diagram illustrating an apparatus for extracting characteristics of a broadband passive element according to an embodiment of the present invention.

Referring to FIG. 7, an apparatus 100 for extracting characteristics of a broadband passive element includes a measuring unit 120, a data storage unit 130, an S-parameter calculation unit 140, and a characteristic output unit 150.

The measuring unit 120 measures the S-parameters for three connection conditions (open condition, first short condition, and second short condition) of the broadband passive element using the GSG microprobe 110. That is, the measuring unit 120 measures the open condition measurement S-parameter the first short condition measurement S-parameter [$S_{ms1}$], and the second short condition measurement S-parameter [$S_{ms2}$] by the one-way measurement of the broadband passive element.

The data storage unit 130 stores the S-parameters [$S_{mo}$], [$S_{mo1}$], and [$S_{mo2}$] of the three connection conditions measured by the measuring unit 120.

The S-parameter calculation unit 140 includes an RLC optimization unit 141 and an S-parameter extraction unit 142, and extracts the S-parameter of the broadband passive element based on the measurement S-parameters [$S_{mo}$], [$S_{mo1}$], and [$S_{mo2}$] in the three connection conditions and the optimized R, L, and C values.

Specifically, the RLC optimization unit 141 performs an RLC optimization process for optimizing variables of the resistances R1 and R2, the inductances $L_1$ and $L_2$, and the capacitances $C_1$, $C_2$, and $C_3$ for the three connection conditions. The RLC optimization process is performed as in S120 to S150 described above with reference to FIG. 6, and redundant description thereof will be omitted.

The S-parameter extraction unit 142 applies the optimal resistances R1 and R2, inductances $L_1$ and $L_2$, and capacitances $C_1$, $C_2$, and $C_3$ output by the RLC optimization unit 141, and the measuring unit 120 and the S-parameters [$S_{mo}$], [$S_{mo1}$], and [$S_{mo2}$] to the S-parameter equation (equation 11) of the broadband passive element to extract the S-parameter (e.g., the S-parameter [$S_{sck}$] of the socket 10) of the broadband passive element.

The characteristic output unit 150 outputs the S-parameter of the broadband passive element extracted by the S-parameter calculation unit 140.

Hereinafter, in order to verify the method for extracting characteristics of a broadband passive element according to the embodiment of the present invention with reference to FIGS. 8A to 11, the result of comparing the characteristics of the socket extracted by the method according to the exemplary embodiment of the present invention and the characteristics of the socket directly measured by the simulator will be described. An ANSYS HFSS 3D EM simulator was used as a simulator.

Figure 9:
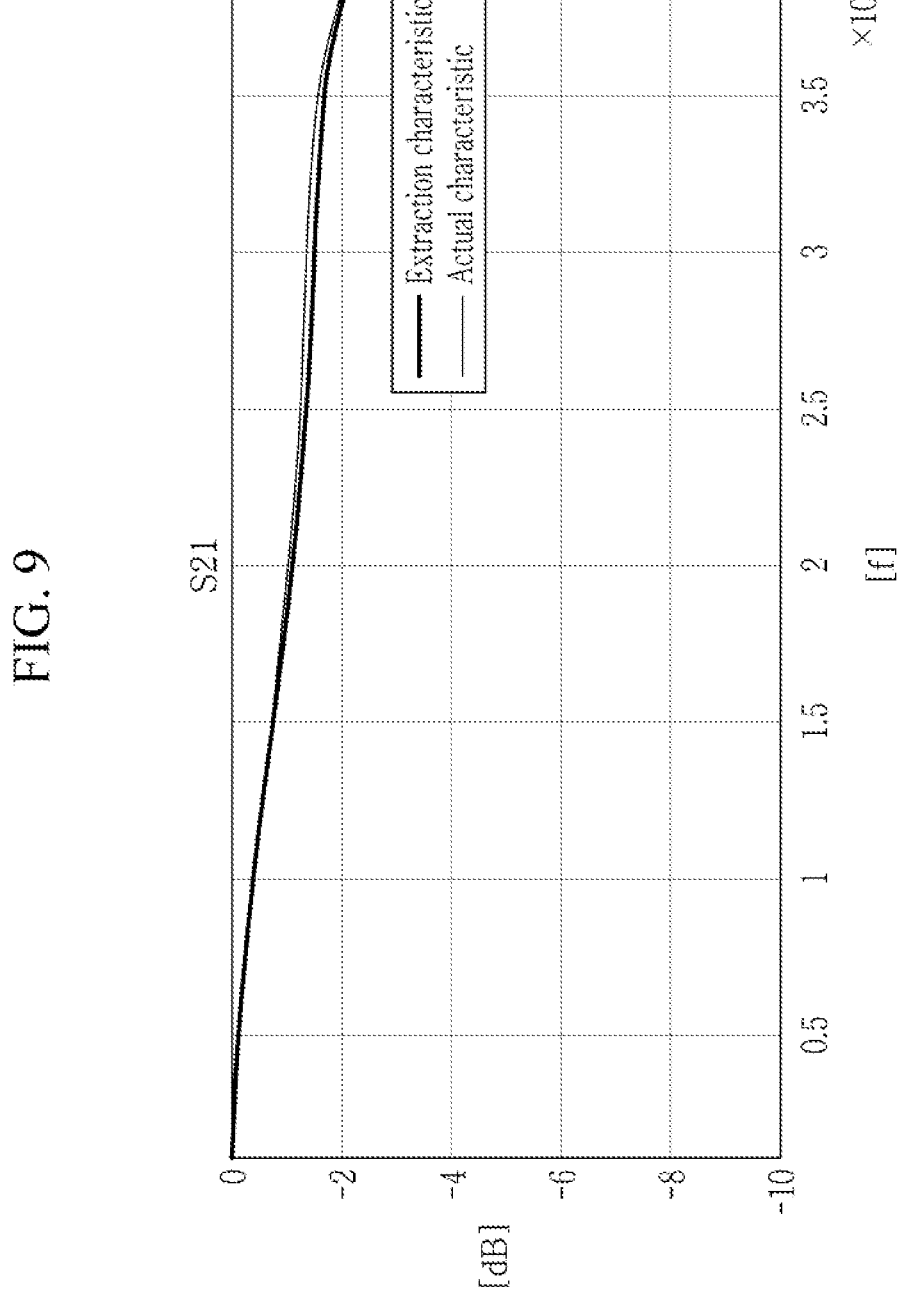
FIG. 9 is a diagram illustrating an S-parameter S21 of a socket extracted by the method according to an embodiment of the present invention and the S-parameter S21 of a socket directly measured by a simulator.
Figure 10:
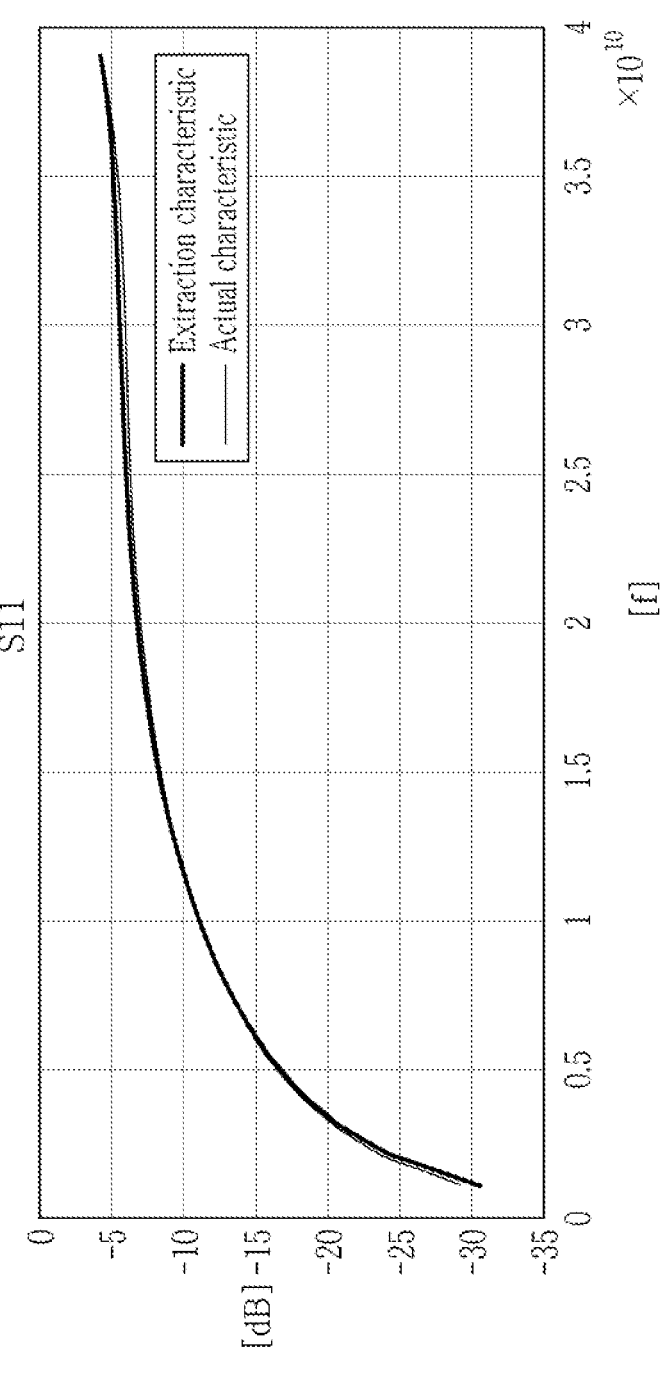
FIG. 10 is a diagram illustrating the S-parameter S11 of the socket extracted by the method according to an embodiment of the present invention and the S-parameter S11 of the socket directly measured by the simulator.
Figure 11:
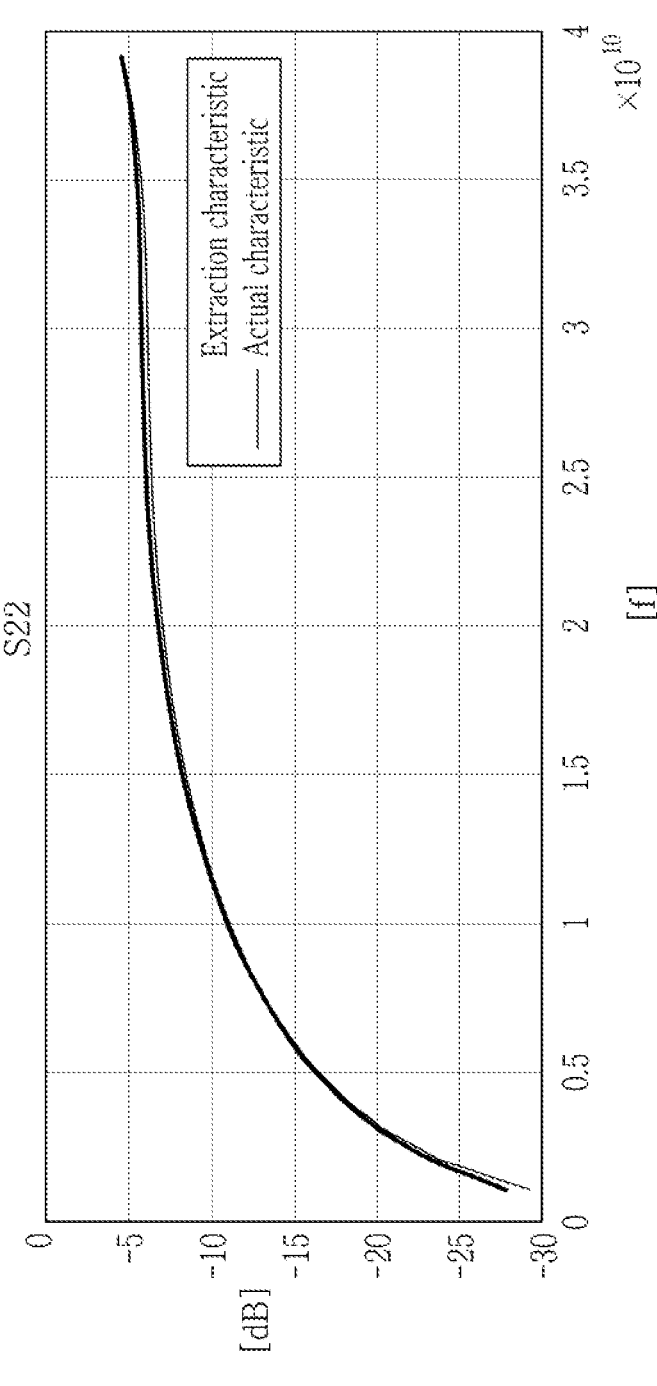
FIG. 11 is a diagram illustrating the S-parameter S22 of the socket extracted by the method according to an embodiment of the present invention and the S-parameter S22 of the socket directly measured by the simulator.

FIGS. 8A to 8C illustrate the open condition socket, the first short condition socket, and the second short condition socket according to the embodiment of the present invention. FIG. 9 is a diagram illustrating an S-parameter S21 of a socket extracted by the method according to an embodiment of the present invention and the S-parameter S21 of a socket directly measured by a simulator. FIG. 10 is a diagram illustrating the S-parameter S11 of the socket extracted by the method according to an embodiment of the present invention and the S-parameter S11 of the socket directly measured by the simulator. FIG. 11 is a diagram illustrating the S-parameter S22 of the socket extracted by the method according to an embodiment of the present invention and the S-parameter S22 of the socket directly measured by the simulator.

Referring to FIGS. 8 to 11, each of the plurality of conductor pins 11 of the socket is designed to have a length of 800 μm and a radius R of 135 μm. A simulation frequency f ranges from 50 MHz to 40 GHz.

As illustrated in FIGS. 9 to 11, it can be seen that the actual characteristics S21, S11, and S22 of the socket measured by the ANSYS HFSS 3D EM simulator and the extraction characteristics S21, S11, and S22 of the socket extracted by the method for extracting characteristics of the broadband passive element according to the embodiment of the present invention are very similar. It can be seen that the characteristics of the broadband passive element may be effectively extracted only by one-way measurement using the method for extracting characteristics of a broadband passive element according to an embodiment of the present invention.

Figure 12:
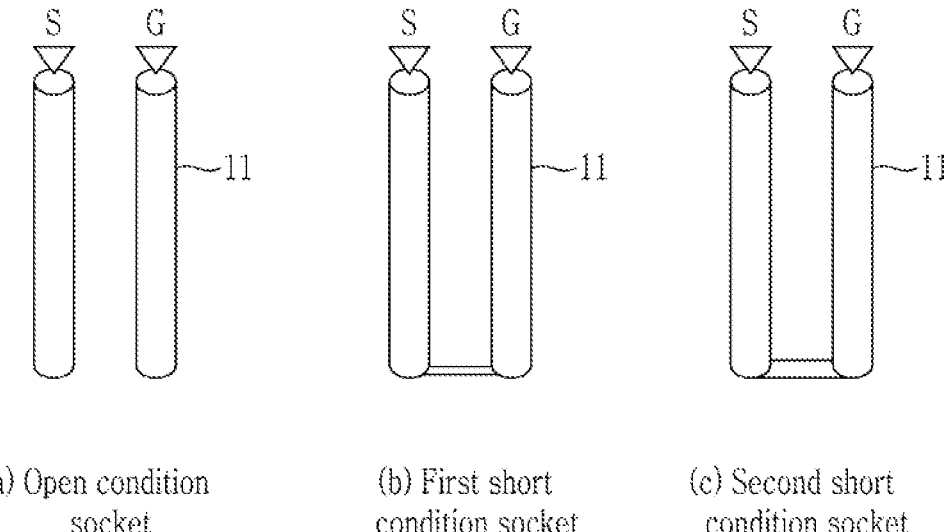
FIGS. 12A to 12C are diagrams illustrating a port of a socket that is a broadband passive element according to another embodiment of the present invention.

FIGS. 12A to 12C are diagrams illustrating a port of a socket that is a broadband passive element according to another embodiment of the present invention.

Referring to FIGS. 12A to 12C, the socket 10 includes two conductor pins 11. In FIGS. 12A to 12C, unlike FIG. 1, the three connection conditions of the socket are configured in the following manner. Specifically, in FIGS. 12A to 12C, the condition of the socket is configured in a condition (open condition) in which one direction (second port) of the socket 10 is open, a condition (first short condition) in which only two adjacent conductor pins are connected in the second port by a short line with a first width, and a condition (second short condition) in which two conductor pins are connected in a second port by a short line with a second width greater than the first width.

In this way, in the state in which the three connection conditions are configured, the open condition measurement S-parameter [$S_{mo}$] the first short condition measurement S-parameter [$S_{mo1}$] and the second short condition measurement S-parameter [$S_{mo2}$] may be measured by one-way measurement using the SG microprobe, respectively.

Then, as described with reference to FIG. 6, the S-parameter [$S_{sck}$] of the broadband passive element may be extracted based on the R, L, and C values optimized through the RLC optimization process, etc., and the measured S-parameters [$S_{mo}$], [$S_{mo1}$], and [$S_{mo2}$] in the three connection conditions.

Figure 13:
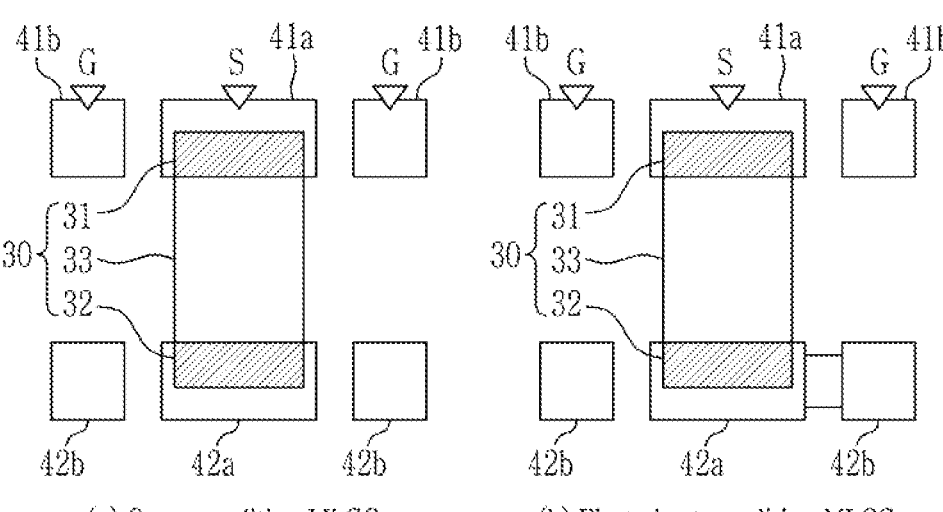
FIGS. 13A to 13C are diagrams illustrating a case where the broadband passive element is a multi-layer ceramic capacitor.
Figure 13:
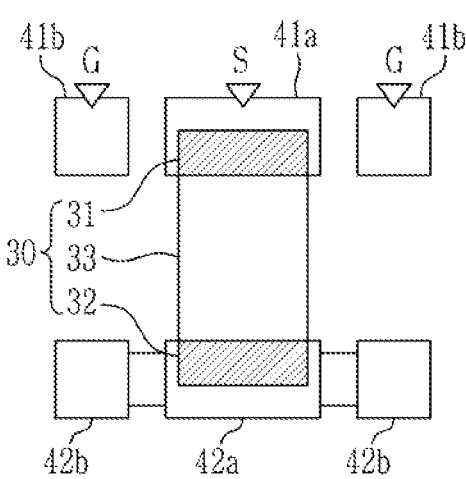

FIGS. 13A to 13C illustrate a case where the broadband passive element is a multi-layer ceramic capacitor.

Referring to FIGS. 13A to 13C, a multi-layer ceramic capacitor (MLCC) 30 includes a first electrode 31, a second electrode 32, and a ceramic dielectric material 33 disposed therebetween. The multi-layer ceramic capacitor 30 may be miniaturized in size by multi-layering the ceramic dielectric material 33 such as titanium oxide, barium titanate, and steatite.

Since the multi-layer ceramic capacitor does not have a conductor pin inside, unlike the socket illustrated in FIG. 1, in order to measure the device characteristics of the multi-layer ceramic capacitor, three upper pads 41a and 42b and three lower pads 42a and 42b are provided. The first electrode 31 and the second electrode 32 of the multi-layer ceramic capacitor 30 are in contact with the upper electrode pad 41a and the lower electrode pad 42a, respectively, and ground pads 41b and 42b at both sides of the electrode pads 41a and 42a are connected to ground.

In FIGS. 13A to 13C, three connection conditions of the multi-layer ceramic capacitor are configured in the following manner. Specifically, in FIGS. 13A to 13C, a state of the multi-layer ceramic capacitor is configured in a condition (open condition) in which all the lower pads are open, a condition (first short condition) in which two adjacent lower pads are connected, and a condition (second short condition) in which three adjacent pads among the lower pads are connected.

In this way, in the state in which the three connection conditions are configured, the open condition measurement S-parameter [$S_{mo}$] the first short condition measurement S-parameter [$S_{mo1}$], and the second short condition measurement S-parameter [$S_{mo2}$] may be measured by measuring each of the upper pads using the GSG microprobe, respectively.

Figure 14:
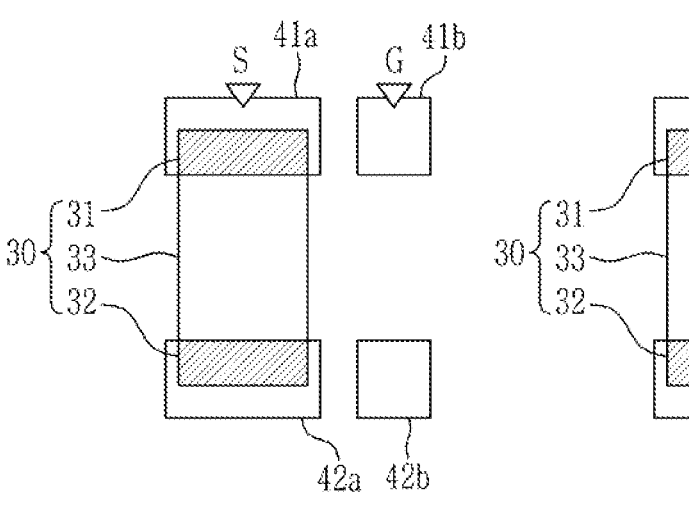
FIGS. 14A to 14C are diagrams illustrating a one-way measurement method of a multi-layer ceramic capacitor according to another embodiment of the present invention.
Figure 14:
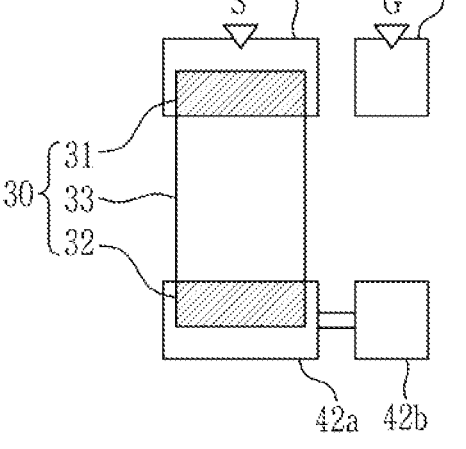
Figure 14:
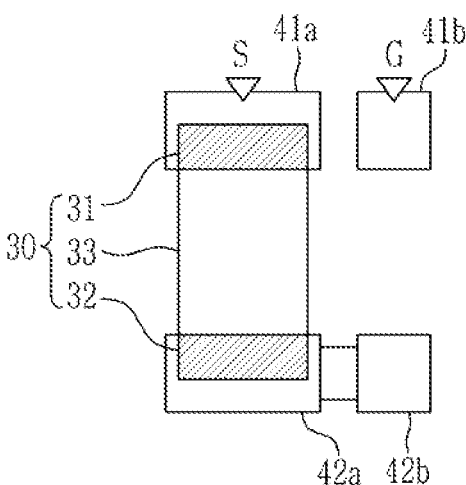

FIGS. 14A to 14C are diagrams illustrating a one-way measurement method of a multi-layer ceramic capacitor according to another embodiment of the present invention.

In FIGS. 14A to 14C, in order to measure the device characteristics of the multi-layer ceramic capacitor, two upper pads 41a and 41b and two lower pads 42a and 42b are provided. The first electrode 31 and the second electrode 32 of the multi-layer ceramic capacitor 30 are in contact with the upper electrode pad 41a and the lower electrode pad 42a, respectively, and the ground pads 41b and 42b are connected to the ground.

In FIGS. 14A to 14C, three connection conditions of the multi-layer ceramic capacitor are configured in the following manner. Specifically, in FIGS. 14A to 14C, the state of the multi-layer ceramic capacitor is configured in the condition (open condition) in which all the lower pads are open, the condition (first short condition) in which two adjacent pads among the lower pads are connected by a line having a first width, and the condition (second short condition) in which three adjacent pads among the lower pads are connected by a line having a second width greater than the first width.

In this way, in the state in which the three connection conditions are configured, the open condition measurement S-parameter [$S_{mo}$], the first short condition measurement S-parameter [$S_{mo1}$], and the second short condition measurement S-parameter [$S_{mo2}$] may be measured by measuring each of the upper pads using the SG microprobe, respectively.

Even in the case of extracting the S-parameter of such a multi-layer ceramic capacitor, the above-described method for extracting characteristics of a broadband passive element may be used as it is. As illustrated, after preparing (a) the open condition multi-layer ceramic capacitor, (b) the first short condition multi-layer ceramic capacitor, and (c) the second short condition multi-layer ceramic capacitor, the S-parameters of the multi-layer ceramic capacitor may be extracted by the method for extracting characteristics of a broadband passive element described above with reference to FIG. 6.

Figure 15:
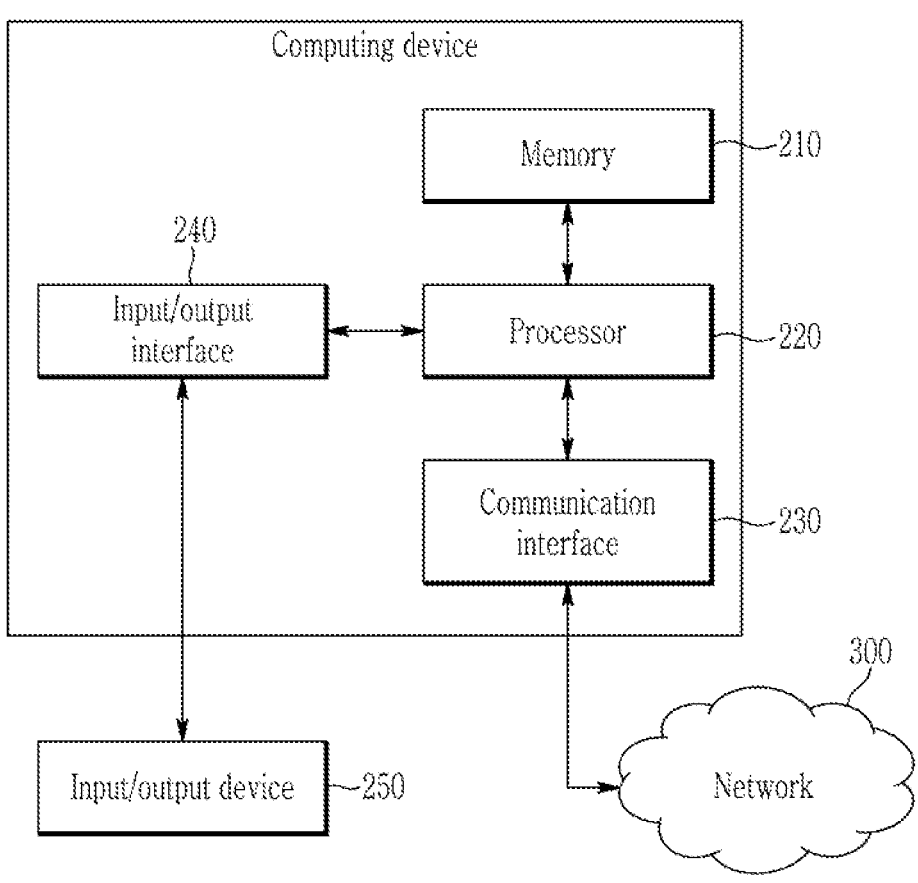
FIG. 15 is a diagram illustrating an example of a computer apparatus according to an embodiment of the present invention.

FIG. 15 is a diagram illustrating an example of a computer apparatus according to an embodiment of the present invention. The method for extracting characteristics of a broadband passive element described in FIG. 6 and the apparatus for extracting characteristics of a broadband passive element described in FIG. 7 may be implemented by the computer device 200 illustrated in FIGS. 13A to 13C.

As illustrated in FIG. 15, the computer device 200 may include a memory 210, a processor 220, a communication interface 230, and an input/output interface 240. The memory 210 is a computer-readable recording medium and may include a random access memory (RAM), a read only memory (ROM), and a permanent mass storage device such as a disk drive. Also, an operating system and at least one program code may be stored in the memory 210. These software components may be loaded into the memory 210 from a computer-readable recording medium separate from the memory 210. The separate computer-readable recording medium may include a computer-readable recording medium such as a hard disk, a flash memory, an optical disk, or an external hard disk. Also, these software components may be loaded into the memory 210 through the communication interface 230.

The processor 220 may be configured to process instructions of a computer program by performing basic arithmetic, logic, and input/output operations. The instruction may be provided to the processor 220 by the memory 210 or the communication interface 230.

The communication interface 230 may provide a function for the computer device 200 to communicate with other devices through the network 300.

The input/output interface 240 may be a means for interface with the input/output device 250. For example, the input device may include a device such as a microphone, a keyboard, or a mouse, and the output device may include a device such as a display or a speaker.

As described above, the method and apparatus for extracting characteristics of a broadband passive element according to the embodiment of the present invention may extract characteristics of various types of broadband passive elements such as resistors, capacitors, inductors, and connectors only by one-way measurement.

The drawings and detailed description of the present invention referred to so far are only examples of the present invention, which are only used for the purpose of explaining the present invention, but are used to limit the scope of the present invention described in the meaning or claims. Therefore, it will be understood by those skilled in the art that various modifications and equivalent other embodiments are possible therefrom. Accordingly, an actual technical scope of the present invention is to be defined by a technical spirit of the following claims.

---

<Description of symbols>

10: Socket 11: Conductor pin
20: Open condition 21: First short condition
22: Second short condition 30: Multi-layer ceramic capacitor
31: First electrode 32: Second electrode
33: Ceramic dielectric material 41, 42: Pad
100: Apparatus for extracting characteristics of broadband passive element
110: Microprobe 120: Measuring unit
130: Data storage unit 140: S-parameter calculation unit
141: RLC optimizer 142: S-parameter extraction unit
150: Characteristic output unit

What is claimed is:

1. A method for extracting characteristics of broadband passive element by one way measurement, comprising:

configuring a broadband passive element in at least three different connection conditions comprising at an open condition, a first short condition, and a second short condition;

respectively measuring while the broadband passive element is configured in each of the at least three different connection conditions, using a microprobe, an open condition measurement S-parameter, a first short condition measurement S-parameter, and a second short condition measurement S-parameter that are S-parameter values measured for three connection conditions of the broadband passive element at a first port which is one direction of the broadband passive element;

deriving optimal resistance, optimal inductance, and optimal capacitance for the three connection conditions by performing an RLC optimization process of the three connection conditions of the broadband passive element using a cost function at a low frequency; and extracting the S-parameter of the broadband passive element based on the measured open condition measurement S-parameter, the measured first short condition measurement S-parameter, and the measured second short condition measurement S-parameter, and the derived optimum resistance, optimum inductance, and optimum capacitance for the three connection conditions.

2. The method of claim 1, wherein:

the broadband passive element includes three conductor pins, and the three connection conditions include:

the open condition in which all of the three conduction pins at a second port in the other direction of the broadband passive element are open;

the first short condition in which two of three conductive pins at the second port are connected and the other conductive pin is open; and the second short condition in which all the three conduction pins at the second port are connected.

3. The method of claim 1, wherein:

the broadband passive element includes two conductor pins, and the three connection conditions include:

the open condition in which two conduction pins at a second port in the other direction of the broadband passive element are open;

the first short condition in which the two conductive pins at the second port are connected with a short line having a first width; and the second short condition in which the two conduction pins at the second port are connected with a short line having a second width greater than the first width.

4. The method of claim 1, wherein:

in the extracting step, the S-parameter of the broadband passive element is extracted based on the S-parameter formula below, and $$S11 = S11_{mo} - \frac{S11_0 \times S21^2}{1 - S11_0 \times S22}$$

$$S21 = \sqrt{\frac{S11_{mo} - S11_{ms1}}{\dfrac{S11_0}{1 - S11_0 \times S22} - \dfrac{S11_{s1}}{1 - S11_{s1} \times S22}}}$$

-continued $$S22 = \frac{(K-1)S11_0 + S11_{s1} - KS11_{s2}}{KS11_0S11_{s1} - S11_0S11_{s2} + (1-K)S11_{s1}S11_{s2}}$$

$$K = \frac{S11_{mo} - S11_{ms1}}{S11_{mo} - S11_{ms2}},$$

$$S11_0 = \frac{Z_{open} - Z_{ref}}{Z_{open} + Z_{ref}}$$

$$S11_{s1} = \frac{Z_{ind1} - Z_{ref}}{Z_{ind1} + Z_{ref}},$$

$$S11_{s2} = \frac{Z_{ind2} - Z_{ref}}{Z_{ind2} + Z_{ref}}$$

$S11_0$ is an RLC modeling S-parameter of the open condition of the broadband passive element, $S11_{s1}$ is an RLC modeling S-parameter of the first short condition of the broadband passive element, $S11_{s2}$ is an RLC modeling of the second short condition of the broadband passive element, $S11_{mo}$ is an open condition measurement S-parameter, $S11_{ms1}$ is a first short condition measurement S-parameter, $S11_{ms2}$ is a second short condition measurement S-parameter, $Z_{ref}$ is a port reference impedance, $Z_{open}$ is impedance in an open condition, $Z_{ind1}$ is impedance in the first condition, and $Z_{ind2}$ is impedance in a second short condition.

5. The method of claim 4, wherein:

the deriving step includes:

setting a range of resistance, inductance, and capacitance for the three connection conditions;

defining the cost function at a low frequency as an absolute value of a difference between S11 and S22 in the S-parameter of the broadband passive element; and deriving the resistance, inductance, and capacitance at which the cost function is minimized through an optimization algorithm using the S-parameter formula and the cost function.

6. The method of claim 2, wherein:

the measuring step includes:

measuring the open condition measurement S-parameter by measuring the first port of the broadband passive element in which the second port is in the open condition using a GSG microprobe;

measuring the first short condition measurement S-parameter by measuring the first port of the broadband passive element in which the second port is in the first short condition using the GSG microprobe; and measuring the second short condition measurement S-parameter by measuring the first port of the broadband passive element in which the second port is in the second short condition using the GSG microprobe.

7. The method of claim 3, wherein:

the measuring step includes:

measuring the open condition measurement S-parameter by measuring the first port of the broadband passive element in which the second port is in the open condition using an SG microprobe;

measuring the first short condition measurement S-parameter by measuring the first port of the broadband passive element in which the second port is in the first short condition using the SG microprobe; and measuring the second short condition measurement S-parameter by measuring the first port of the broadband passive element in which the second port is in the second short condition using the SG microprobe.

8. The method of claim 1, wherein:

the broadband passive element is a socket for connecting a semiconductor chip to a measurement board.

9. The method of claim 1, wherein:

the broadband passive element is a multi-layer ceramic capacitor including a first electrode, a second electrode, and a ceramic dielectric material disposed between the first electrode and the second electrode.

10. The method of claim 9, wherein:

the measuring step includes:

providing first pads at a first port of the multi-layer ceramic capacitor; providing second pads at a second port of the multi-layer ceramic capacitor; and contacting the first electrode to one of the first pads and contacting the second electrode to one of the second pads.

11. The method of claim 10, wherein:

the first pads and the second pads include three pads, and the three connection conditions include:

the open condition in which all of the second pads are open;

the first short condition in which two adjacent pads of the second pads are connected and the other pad is open; and the second short condition in which all three pads among the second pads are connected.

12. The method of claim 10, wherein:

the first pads and the second pads include two pads, and the three connection conditions include:

the open condition in which all of the second pads are open;

the first short condition in which two adjacent pads among the second pads are connected by a line having a first area; and the second short condition in which two adjacent pads among the second pads are connected by a line having a second area greater than the first area.

13. An apparatus for extracting characteristics of broadband passive element by one-way measurement, comprising:

a unit configured to configure a broadband passive element in at least three different connection conditions comprising at an open condition, a first short condition, and a second short condition:

a measuring unit configured to respectively measure while the broadband passive element is configured in each of the at least three different connection conditions, using a microprobe, an open condition measurement S-parameter, a first short condition measurement S-parameter, and a second short condition measurement S-parameter that are S-parameter values measured for three connection conditions of the broadband passive element at a first port which is one direction of the broadband passive element;

an S-parameter calculation unit configured to extract an S-parameter of the broadband passive element based on the open condition measurement S-parameter, the first short condition measurement S-parameter, and the second short condition measurement S-parameter measured by the measuring unit, and optimal resistance, inductance, and capacitance for the three connection conditions wherein optimal resistance, inductance, and capacitance is derived by performing an RLC optimization process of the three connection conditions using a cost function at a low frequency; and an output unit configured to output the S-parameter of the broadband passive element output by the S-parameter calculation unit.

14. The apparatus of claim 13, wherein:

the S-parameter calculation unit includes:

an RLC optimizer configured to perform the RLC optimization process for optimizing variables of the resistance, inductance, and capacitance for the three connection conditions; and an S-parameter extraction unit configured to extract the S-parameter of the broadband passive element based on the optimal resistance, inductance, and capacitance output by the RLC optimizer and the open condition measurement S-parameter, the first short condition measurement S-parameter, and the second short condition measurement S-parameter measured by the measuring unit.

15. The apparatus of claim 14, wherein:

the S-parameter extraction unit extracts the S-parameter of the broadband passive element based on the S-parameter formula below, and $$S11 = S11_{mo} - \frac{S11_0 \times S21^2}{1 - S11_0 \times S22}$$

$$S21 = \sqrt{\frac{S11_{mo} - S11_{ms1}}{\frac{S11_0}{1 - S11_0 \times S22} - \frac{S11_{s1}}{1 - S11_{s1} \times S22}}}$$

$$S22 = \frac{(K-1)S11_0 + S11_{s1} - KS11_{s2}}{KS11_0S11_{s1} - S11_0S11_{s2} + (1-K)S11_{s1}S11_{s2}}$$

$$K = \frac{S11_{mo} - S11_{ms1}}{S11_{mo} - S11_{ms2}},$$

$$S11_0 = \frac{Z_{open} - Z_{ref}}{Z_{open} + Z_{ref}}$$

$$S11_{s1} = \frac{Z_{ind1} - Z_{ref}}{Z_{ind1} + Z_{ref}},$$

$$S11_{s2} = \frac{Z_{ind2} - Z_{ref}}{Z_{ind2} + Z_{ref}}$$

$S11_0$ is an RLC modeling S-parameter of an open condition of the broadband passive element, $S11_{s1}$ is an RLC modeling S-parameter of a first short condition of the broadband passive element, $S11_{s2}$ is an RLC modeling of a second short condition of the broadband passive element, $S11_{mo}$ is an open condition measurement S-parameter, $S11_{ms1}$ is a first short condition measurement S-parameter, $S11_{ms2}$ is a second short condition measurement S-parameter, $Z_{ref}$ is a port reference impedance, $Z_{open}$ is impedance in an open condition, $Z_{ind1}$ is impedance in the first condition, and $Z_{ind2}$ is impedance in a second short condition.

16. The apparatus of claim 15, wherein:

the RLC optimization unit sets a range of resistance, inductance, and capacitance for the three connection conditions, defines the cost function at a low frequency as an absolute value of a difference between S11 and S22 in the S-parameter of the broadband passive element, and derives the resistance, inductance, and capacitance at which the cost function is minimized through an optimization algorithm using the S-parameter formula and the cost function.

17. The apparatus of claim 13, wherein:

the broadband passive element includes three conductor pins, and the measuring unit measures the open condition measurement S-parameter by measuring the first port of the broadband passive element using a GSG microprobe in the open condition in which all the three conductor pins at the second port in the other direction of the broadband passive element are open, measures the first short condition measurement S-parameter by measuring the first port of the broadband passive element using the GSG microprobe in the first short condition in which two conductor pins among the three conductor pins at the second port are connected and the other conductor pin is open, and measures the second short condition measurement S-parameter by measuring the first port of the broadband passive element using the GSG microprobe in the second short condition in which three adjacent conductors at the second port are connected.

18. The apparatus of claim 13, wherein:

the broadband passive element includes two conductor pins, and the measuring unit measures the open condition measurement S-parameter by measuring the first port of the broadband passive element using an SG microprobe in the open condition in which the two conductor pins at the second port in the other direction of the broadband passive element are open, measures the first short condition measurement S-parameter by measuring the first port of the broadband passive element using the SG microprobe in the first short condition in which the two conductor pins are connected by a short line of a first width in the second port at the second port, and measures the second short condition measurement S-parameter by measuring the first port of the broadband passive element using the SG microprobe in the second short condition in which the two conductor pins at the second port are connected by a short line having a second width greater than the first width.

19. The apparatus of claim 13, wherein:

the broadband passive element is a socket for connecting a semiconductor chip to a measurement board.

20. The apparatus of claim 13, wherein:

the broadband passive element is a multi-layer ceramic capacitor including a first electrode, a second electrode, and a ceramic dielectric material disposed between the first electrode and the second electrode.

21. The apparatus of claim 20, wherein:

the measuring unit provides first pads at a first port of the multi-layer ceramic capacitor, provides second pads at a second port of the multi-layer ceramic capacitor, and measures the open condition measurement S-parameter, the first short condition measurement S-parameter, and the second short condition measurement S-parameter by bringing the first electrode into contact with one of the first pads and the second electrode into contact with one of the second pads.

22. A non-transitory computer program product storing instructions executed by at least one processor of at least one computer system, by one way measurement comprising:

an operation of configuring a broadband passive element in at least three different connection conditions comprising at an open condition, a first short condition, and a second short condition;

an operation of respectively measuring while the broadband passive element is configured in each of the at least three different connection conditions, using a microprobe, an open condition measurement S-parameter, a first short condition measurement S-parameter, and a second short condition measurement S-parameter that are S-parameter values measured for three connection conditions of the broadband passive element at a first port which is one direction of the broadband passive element;

an operation of deriving optimal resistance, optimal inductance, and optimal capacitance for the three connection conditions by performing an RLC optimization process of the three connection conditions of the broadband passive element; and an operation of extracting the S-parameter of the broadband passive element based on the obtained open condition measurement S-parameter, first short condition measurement S- parameter, and second short condition measurement S-parameter, and the derived optimum resistance, optimum inductance, and optimum capacitance, wherein extracting characteristics of the broadband passive element is only by one way measurement.

* * * * *